United States Patent [19]
Ito

[11] Patent Number: 4,810,668
[45] Date of Patent: Mar. 7, 1989

[54] SEMICONDUCTOR DEVICE ELEMENT-ISOLATION BY OXIDATION OF POLYSILICON IN TRENCH

[75] Inventor: Takao Ito, Ithaca, N.Y.

[73] Assignee: Kabushiki Kaisha Toshiba, Kawasaki, Japan

[21] Appl. No.: 72,446

[22] Filed: Jul. 13, 1987

[30] Foreign Application Priority Data

Jul. 18, 1986 [JP] Japan ............................ 61-169245

[51] Int. Cl.⁴ .......................................... H01L 21/473
[52] U.S. Cl. ............................ 437/67; 437/72; 357/55
[58] Field of Search ..................... 437/67, 72, 61

[56] References Cited

U.S. PATENT DOCUMENTS

| | | | |
|---|---|---|---|
| 4,356,211 | 10/1982 | Riseman | 437/64 X |
| 4,528,047 | 7/1985 | Beyer et al. | 437/67 |
| 4,546,538 | 10/1985 | Suzuki | 437/67 |
| 4,621,414 | 11/1986 | Iranmanesh | 437/69 |
| 4,700,464 | 10/1987 | Okada et al. | 437/67 |

FOREIGN PATENT DOCUMENTS 57-60851 4/1982 Japan .

Primary Examiner—Olik Chaudhuri
Attorney, Agent, or Firm—Finnegan, Henderson, Farabow, Garrett, & Dunner

[57] ABSTRACT

A method of manufacturing a semiconductor apparatus is disclosed, in which in the method of isolating elements, is improved. A groove is cut in a semiconductor substrate. Elements are isolated from each other by embedding an insulating material in the groove, in two divided portions. The time required for depositing an insulating material is reduced, thereby forming a uniform insulation layer on the semiconductor substrate. Since the insulating material can be etched in a shorter period of time than was previously required, the etching process can be more finely controlled. Since a field oxide layer is formed by oxidizing an insulation layer formed for the first time, the field oxide layer can be provided without oxidizing those portions of the semiconductor substrate which lie near the groove. Consequently, the seminconductor substrate can be free from crystalline defects.

12 Claims, 7 Drawing Sheets

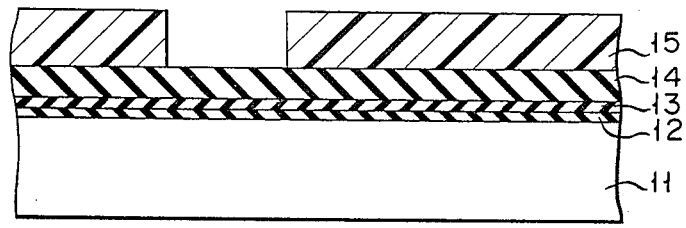
F I G. 2A
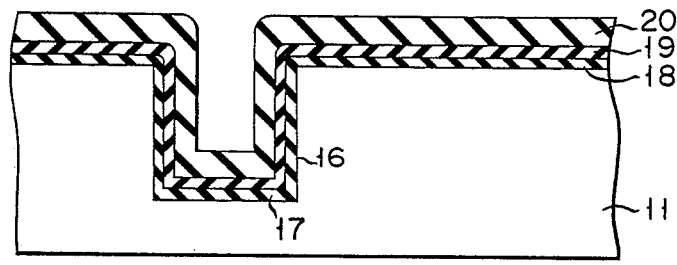
F I G. 2B
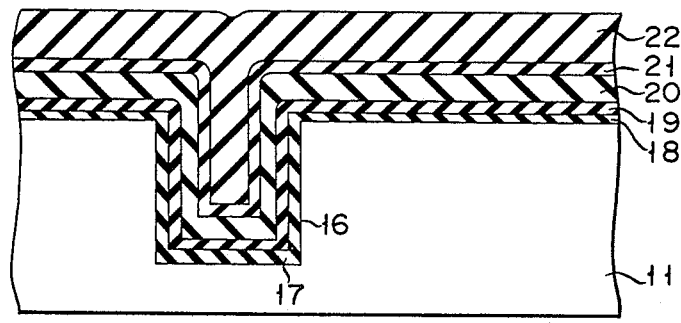
F I G. 2C

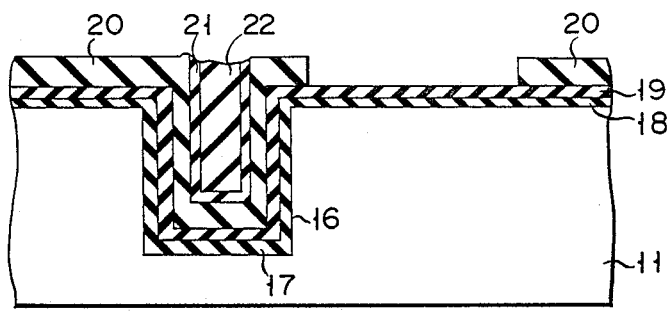
F I G. 2D
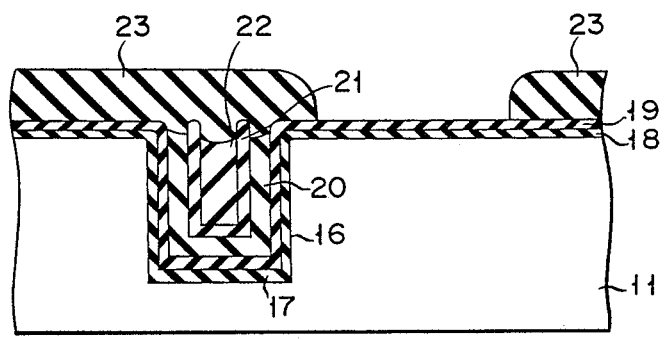
F I G. 2E

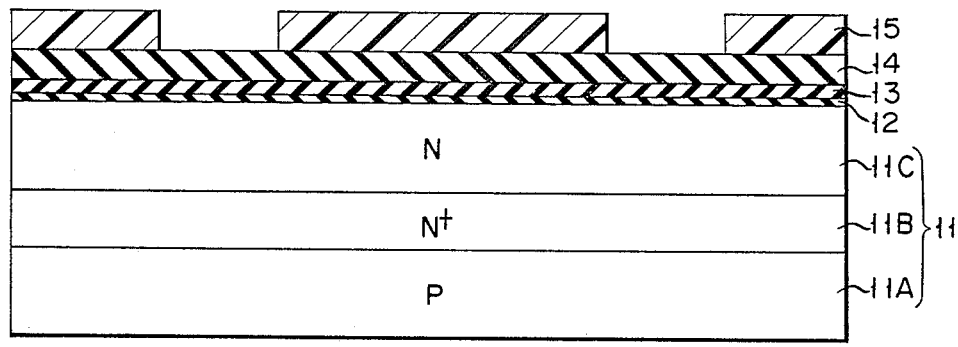
F I G. 3A
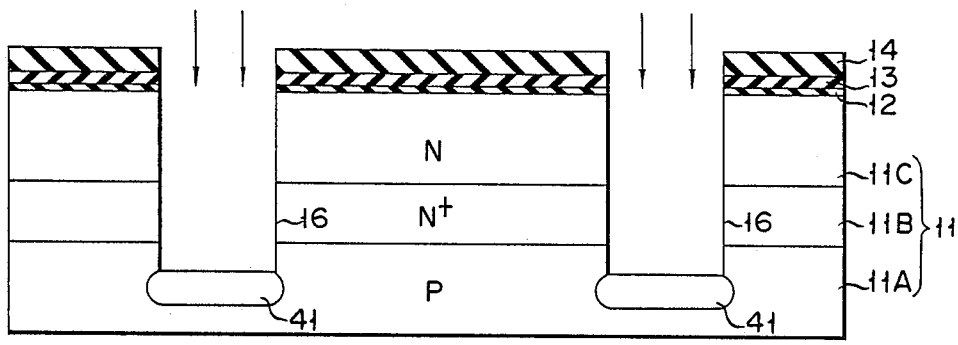
F I G. 3B
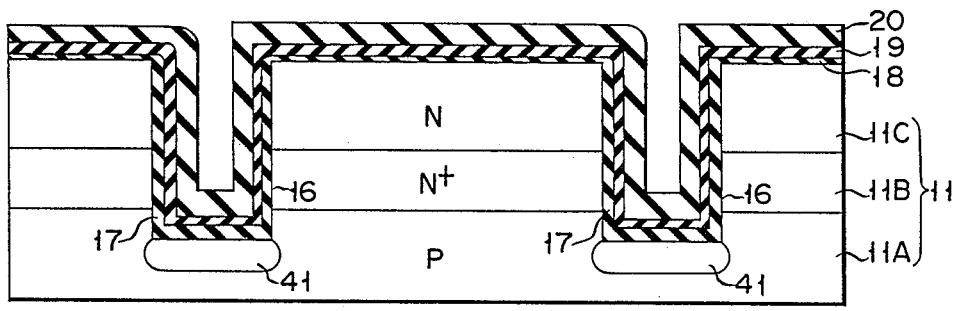
F I G. 3C

1

SEMICONDUCTOR DEVICE ELEMENT-ISOLATION BY OXIDATION OF POLYSILICON IN TRENCH

BACKGROUND OF THE INVENTION

This invention relates to a semiconductor apparatus manufacturing method, which features an improved method of isolating elements.

In recent times, the isolating of various elements such as a transistor, diode, and resistor, all deposited on the same substrate of a semiconductor integrating circuit, has tended to be accomplished by use of the trench isolation process. Using this process, a groove is formed in a semiconductor substrate, a polycrystalline silicon layer is embedded in the groove, and an insulation layer is interposed therebetween, thereby to isolate the respective elements. This process has the merit of reducing the size of isolation region and, consequently, the parasitic capacitance.

FIGS. 1A–1D show the sequential steps of a semiconductor apparatus-manufacturing method using the conventional trench isolation process.

First, the surface of silicon substrate 31 is oxidized, thereby forming oxide layer 32. Then, silicon nitride layer 33 is formed on oxide layer 32, followed by silicon oxide layer 34 being formed on silicon nitride layer 33, by way of chemical vapor deposition (CVD). Silicon oxide layer 34 acts as a mask during the etching of substrate 31. Photoresist layer 35 is coated on silicon oxide layer 34. Light exposure and development are applied on photoresist layer 35, thereby performing patterning (FIG. 1A).

Subsequently, silicon oxide layer 34, silicon nitride layer 33, and oxide layer 32 are selectively etched in succession, with photoresist layer 35 serving as a mask. Thereafter, photoresist layer 35 is removed, and silicon substrate 31 is selectively etched, thereby forming groove 36 by means of the anisotropic etching process, involving use of the reactive ion etching (RIE) process and of silicon oxide layer 34 as an etching mask. Thereafter, silicon oxide layer 34 is removed. After silicon oxide layer 37 is formed on the inner periphery of groove 36, polycrystalline silicon layer 38 is grown to a thickness equivalent to twice the width of groove 36 (FIG. 1B).

Then, polycrystalline silicon layer 38 is etched until the surface of silicon nitride 33 is exposed. As a result, polycrystalline silicon layer 38 is retained only in the interior of groove 36 (FIG. 1C).

The surface of layer 38 retained inside of groove 16 is oxidized, by using silicon nitride layer 33 as an acid-proof mask thereby forming thick field oxide layer 39 (FIG. 1D). Later, elements are formed on portions of the semiconductor apparatus other than groove 36.

However, the aforementioned trench isolating process is accompanied with the following drawbacks:

① Thick polycrystalline silicon layer 38 has to be applied to fill up groove 36. A long time has to be consumed in the growth and etching of thick polycrystalline layer 38.

② Difficulties arise in the etching of thick polycrystalline layer 38; for example, stepped portions tend to be formed in groove 36.

Referring to the drawback described in ②, if the width of groove 36 is 1.5 microns, polycrystalline silicon layer 38 must have a thickness of around 3 microns. Consequently, a stepped portion higher than 1 micron will be formed due to variations in the thickness of polycrystalline silicon layer 38 and in the extent of etching.

With the aim of resolving the above-mentioned difficulties, Japanese patent disclosure No. 57-60851 sets forth the following process:

This process involves causing only the upper portion of the groove to be inclined slightly, so as to prevent the stepped portion from rising steeply. The process is, however, defective in that the element-isolating region is inevitably made wider than groove 36, and moreover, a certain limitation is imposed on the contraction of the element-isolating region.

In addition, an oxide layer grown in a field region other than the element section has to be grown quite thick, in order to reduce the line capacity or to increase the reliability of the integrated circuit. A formation of a field oxide layer by means of oxidizing the silicon substrate tends, as has already been explained, to give rise to crystalline defects occuring in the neighborhood of groove 36. In the process of FIG. 1D, when thick silicon oxide layer 39 is formed by oxidizing the surface of polycrystalline layer 38, that portion of substrate 31 which lies near groove 36 is adversely oxidized at the same time, thereby increasing the incidence of crystalline defects in substrate 31.

SUMMARY OF THE INVENTION

It is accordingly the object of this invention to provide a method of manufacturing a semiconductor apparatus, wherein polycrystalline silicon layers can be grown and etched in the shortest time possible, and wherein no stepped portions are formed on the surface of the apparatus, nor are crystal defects formed in the substrate of the apparatus.

A method of manufacturing a semiconductor device according to the present invention comprises the steps of: forming a groove in a semiconductor substrate; forming a first continuous insulation layer on the inner periphery of the groove and the surface of the semiconductor substrate; forming a first polycrystalline silicon layer on the first insulation layer, the first polycrystalline silicon layer being of a thickness such that the groove is not completely filled; coating the first polycrystalline silicon layer with a second insulation layer; forming a second polycrystalline silicon layer on the second insulation layer, to a thickness sufficient to fill up the groove; retaining the second polycrystalline silicon layer only in the groove; retaining that portion of the first polycrystalline silicon layer which is formed on the semiconductor substrate at least in the neighborhood of the groove; and oxidizing the first and second polycrystalline silicon layers, to form a field oxide layer.

Since the groove is narrowed by the first polycrystalline silicon layer, the second polycrystalline silicon layer is deposited to fill up the groove in a short time. Further, the second polycrystalline silicon layer can be etched in a relatively short period of time.

In addition, the etching of the second polycrystalline silicon layer can be accurately controlled since the etching of the second polycrystalline silicon layer is stopped when a surface of the second insulation layer formed on the flat surface of the substrate is exposed.

Furthermore, a field oxide layer can be formed without the risk of oxidizing that portion of the substrate close to the groove; the field oxide film being formed by oxidizing the first polycrystalline silicon layer. As a result, the risk of generating crystal defects in the substrate is significantly reduced.

BRIEF DESCRIPTION OF THE DRAWINGS

FIGS. 2A-2E illustrate the sequential steps of manufacturing a semiconductor apparatus according to the method of this invention.

More precisely, FIG. 2A depicts the process of forming, on a semiconductor substrate, a first silicon oxide layer, a first silicon nitride layer, and a silicon oxide layer, which serves as a mask during the etching of the substrate, in the order states, after which a photoresist layer is formed on the silicon oxide layer, and is then patterned.

FIG. 2B illustrates the process of etching the second silicon oxide layer which serves as the above-mentioned etching mask, the first silicon nitride layer, and the first silicon oxide layer, removing the photoresist layer, selectively etching the semiconductor substrate to form a groove, eliminating the second silicon oxide layer, which served as a mask, depositing a third silicon oxide layer on the inner peripheral wall of the groove, removing the first silicon nitride layer formed on the substrate and the first silicon oxide layer, forming a fourth silicon oxide layer and a second silicon nitride layer on the entire surface of the laminated mass, including the inner wall of the groove, and lastly, depositing a first polycrystalline silicon layer.

FIG. 2C illustrates the process of forming a second silicon nitride layer on the first polycrystalline silicon layer, and thereafter depositing a second polycrystalline silicon layer, so as to fill up the groove.

FIG. 2D sets forth the process of etching the second polycrystalline silicon layer, thereby to retain only the second polycrystalline silicon layer formed in the groove, eliminating the second silicon nitride layer, and selectively retaining the first polycrystalline silicon layer only in the neighborhood of the groove, and that portion of the semiconductor substrate on which no element is formed.

FIG. 2E shows the process of oxidizing the surface of the first polycrystalline silicon layer and the surface of the second polycrystalline silicon layer covering the groove, thereby providing a field oxide layer.

FIGS. 3A-3J represent the process used when the method of manufacturing the semiconductor apparatus embodying this invention is applied to the fabrication of a bipolar transistor. In more detail, FIG. 3A shows the process of depositing the first silicon oxide layer, the first silicon nitride layer, and the second silicon oxide layer, which serves as a mask during the etching of the substrate, in the order stated, on a silicon semiconductor layer consisting of P-type silicon substrate, N+-type embedded layer, and N-type epitaxial layer, mounting a photoresist on the second silicon oxide layer, and later patterning the photoresist.

FIG. 3B illustrates the process of selectively etching the second silicon oxide layer, the first silicon nitride layer, and the first silicon oxide layer, with the photoresist layer serving as a mask, removing the photoresist, selectively etching the substrate, with the second silicon oxide layer serving as a mask, thereby forming a groove, and defining a channel stopper region at the bottom of the groove.

FIG. 3C sets forth the process of removing the second silicon oxide layer serving as a mask, depositing a third silicon oxide layer on the inner wall of the groove, eliminating all the layers retained on the surface of the substrate, forming a fourth silicon oxide layer and a second silicon nitride layer on the entire surface of the laminated mass, including the inner wall of the groove, and depositing a first polycrystalline silicon layer.

FIG. 3D shows the process of forming a second nitride layer on the first polycrystalline silicon layer, and depositing the second polycrystalline silicon layer to fill up the groove.

FIG. 3E illustrates the process of etching the second polycrystalline silicon layer until that portion of the surface of the second silicon nitride layer lying on the flat plane of the substrate is exposed, retaining the second polycrystalline layer only in the interior of the groove, removing the second silicon nitride layer by means of the isotropic etching method, and performing patterning in such a manner that the first polycrystalline silicon layer is selectively retained only in the neighborhood of the groove and that portion of the surface of the semiconductor substrate on which no element is deposited.

FIG. 3F shows the process of oxidizing the surface of the first polycrystalline silicon layer and the second polycrystalline silicon layer, thereby forming a field oxide layer.

FIG. 3G illustrates the process of forming a photoresist over the entire surface of the substrate, patterning the photoresist, ion implanting phosphorus, thereby depositing an N+-type collector region-drawing layer on an N-type epitaxial layer.

FIG. 3H sets forth the process of forming a photoresist layer over the entire surface of the substrate, patterning the photoresist so as to be retained on the collector region-drawing layer, ion implanting boron, with the photoresist layer and the field oxide layer serving as masks, and depositing a P-type base layer on the surface of an N-type epitaxial layer.

FIG. 3I represents the process of forming a photoresist over the entire surface of the substrate, patterning the photoresist in such a manner that a perforated opening is formed in the collector-drawing layer as well as in the base layer, and ion implanting phosphorus, so as to provide an N-type emitter region on the surface of the base region.

FIG. 3J illustrates the process of providing a collector electrode, a base electrode, and an emitter electrode, thereby completing an NPN transistor.

DETAILED DESCRIPTION OF THE PREFERRED EMBODIMENTS

Figure 1A:
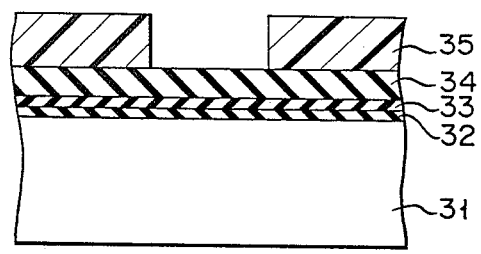
FIGS. 1A-1D illustrate the sequential steps of manufacturing a conventional semiconductor apparatus.
Figure 1B:
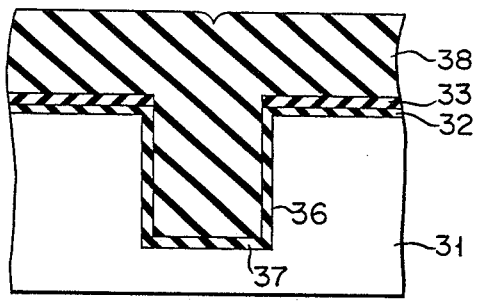
Figure 1C:
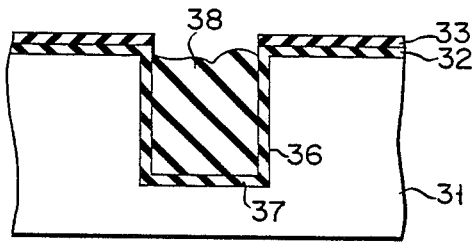
Figure 1D:
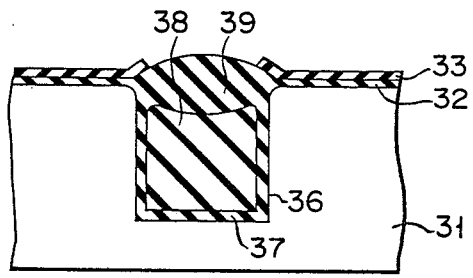

A semiconductor apparatus embodying the present invention will now be described, with reference to the accompanying drawings.

FIGS. 2A-2E are sectional views illustrating the sequential steps of manufacturing a semiconductor apparatus embodying this invention. Silicon oxide layer 12 is formed to a thickness of 500-2000 Å by thermally oxidizing the surface of silicon semiconductor substrate 11 in an atmosphere of $O_2$ gas, $H_2+O_2$ gases, or steam kept at a temperature of 900°-1100° C., or by the CVD method. Silicon nitride layer 13 is deposited to a thickness of 500-3000 Å on silicon oxide layer 12, by the decompressed CVD process. Silicon oxide layer 14 is formed to a thickness of 4000-15000 Å on silicon nitride layer 13, by use of the CVD method. Silicon oxide layer 14 later serves as a mask during the selective etching of semiconductor substrate 11. Photoresist layer 15 is formed on silicon oxide layer 14, and is subjected to light exposure and development, to perform patterning (FIG. 2A).

Silicon oxide layer 14, silicon nitride layer 13, and silicon oxide layer 12 are etched in the order stated, with photoresist 15 serving as an etching mask, by means of an anisotropic dry etching method; for example, reactive ion etching (referred to as "RIE"), involving the use of a gas such as tetrafluoromethane ($CF_4$). Later, photoresist layer 15 is removed by being burnt in an oxygen plasma, or else dissolved in an aqueous solution of sulfuric acid base material. Semiconductor substrate 11 is selectively etched by use of the anisotropic etching technique involving the RIE method, with silicon oxide layer 14 serving as an etching mask, thereby forming groove 16. The characteristic feature of the isotropic etching process causes the side wall of groove 16 to indicate a perpendicular or substantially perpendicular plane to the flat surface of semiconductor substrate 11. After this, silicon oxide layer 14, which served as the etching mask, is removed, and immediately afterwards, silicon oxide layer 17 is deposited on the inner peripheral wall of groove 16 by way of the thermal oxidation process. Subsequently, silicon nitride layer 13 and silicon oxide layer 12 are totally removed, silicon oxide layer 18 is deposited by means of the thermal oxidation process, and silicon nitride layer 19 is deposited by use of the CVD process, layers 18 and 19 both covering the entire surface of semiconductor substrate 11, including the inner peripheral wall of groove 16. Subsequently, polycrystalline layer 20 is grown a thickness of about 1000–5000 Å, by means of the CVD process (FIG. 2B).

Silicon nitride layer 21 is formed, by means of the CVD process, to a thickness of about 1000 Å on the surface of polycrystalline silicon layer 20. Subsequently, polycrystalline silicon layer 22 is grown, by way of the CVD process, so as to fill groove 16. The thickness of polycrystalline silicon layer 22 is defined with the width of groove 16 taken into account. Assuming that groove 16 has a width of 1.5 microns, and that polyrystalline silicon layer 22 has a thickness of about 1 micron, groove 16 can be substantially filled (FIG. 2C).

Polycrystalline silicon layer 22 is etched by use of the anisotropic dry etching process involving the application of a gas plasma of chlorine base, until that portion of silicon nitride layer 21 which is formed on the flat surface of semiconductor substrate 11 is exposed. As a result of this etching, only that portion of second polycrystalline silicon layer 22 deposited in the interior of groove 16 is retained. That portion of silicon nitride layer 21 which is exposed on the surface is eliminated by means of isotropic dry etching. Subsequently, patterning is performed in such a manner (FIG. 2D) that polycrystalline silicon layer 20 is selectively retained only in the neighborhood of groove 1 and on that portion of the surface of the semiconductor substrate on which no element is deposited (FIG. 2D).

Afterwards, the surface of polycrystalline silicon layer 20 and that of polycrystalline silicon layer 22 embedded in groove 16 are thermally oxidized to thereby form thick field oxide layer 23 (FIG. 2E). Thereafter, elements are formed on portions of semiconductor substrate 11 other than groove 16. The above-mentioned steps ultimately provide an element-isolation region consisting of groove 16.

The foregoing deposition method causes polycrystalline silicon layer 22 to fill up a groove narrower than the original width of groove 16, thereby enabling groove 16 to be filled in a shorter time than might otherwise be required. To provide a concrete example: if the original width of groove 16 is defined to be 1.5 microns, as in the case of the prior art, polycrystalline silicon layer 22 will have to be deposited to a thickness of about 3 microns, in order to fill groove 16. According to the embodiment of the present invention, however, it will suffice if polycrystalline silicon layer 22 is deposited to a thickness of 1 micron. The invention offers further advantages, in that polycrystalline silicon layer 22, being of low thickness, can be etched to the required extent in a shorter time; since the etching of polycrystalline silicon layer 22 has only to be carried out until silicon nitride layer 21, formed on the flat plane of semiconductor substrate 11, is exposed, the etching process can be very finely controlled; since polycrystalline silicone layer 22 is etched under a high degree of control, field oxide layer 23 can subsequently be deposited to an optimum thickness; the occurrence of a stepped portion can be prevented thereby preserving the flatness of the surface of the semiconductor substrate; since retained first polycrystalline silicon layer 20 is oxidized to form field oxide layer 23, semiconductor substrate 11 is not oxidized in the vicinity of groove 16, as a result, suppressing the occurrence of crystal defects which might otherwise arise due to the oxidation of semiconductor substrate 11.

FIGS. 3A–3J are the sectional views of the sequential steps of manufacturing a bipolar transistor embodying the present invention.

Silicon semiconductor substrate 11 is constructed by embedding $N^+$-type layer 11B in the surface of P-type silicon substrate 11A, and growing N-type epitaxial layer 11C on embedded layer 11B.

Silicon oxide layer 12 is formed to a thickness of 500–2000 Å on the surface of epitaxial layer 11C, by means of the thermal oxidation or CVD process, in an atmosphere of $O_2$ gas, $H_2+O_2$ gases or steam which is kept at a temperature of 900°–1000° C. Silicon nitride layer 13 is deposited on silicon oxide layer 12, to a thickness of 500–3000 Å, by means of, for example, the decompressed CVD process. Then, silicon oxide layer 14, which serves as a mask during the etching of substrate 11, is formed to a thickness of 4000–15000 Å on silicon nitride layer 13, by means of the CVD process. Photoresist 15 is then formed on silicon oxide layer 14. Photoresist 15 undergoes light exposure and development, and unnecessary portions are removed, thereby to effect patterning (FIG. 3A).

Subsequently, and with photoresist layer 15 serving as an etching mask, silicon oxide layer 14, silicon nitride layer 13, and silicon oxide layer 12 are selectively etched, in the order stated, by means of an anisotropic dry etching process (for example, RIE) involving the use of a gas; for example, tetrafluoromethane ($CH_4$). Thereafter, photoresist layer 15 is removed by being burnt in a plasma of oxygen or else dissolved in an aqueous solution of sulfuric acid base. Then, semiconductor substrate 11 is selectively etched, with silicon oxide layer 14 serving as an etching mask, by way of an anisotropic etching process involving the use of RIE, thereby forming groove 16 which reaches P-type silicon substrate 11A. The characteristic feature of the anisotropic etching renders the side wall of groove 16 perpendicular or substantially perpendicular to the flat surface of semiconductor substrate 11. Subsequently, boron is ion implanted perpendicularly from the surface of semiconductor substrate 11, thereby forming channel stopper region 41 on that portion of semiconductor substrate 11A which is positioned at the bottom of groove 16 (FIG. 3B).

Subsequently, silicon oxide layer 14, which served as an etching mask, is removed, and silicon oxide layer 17 is deposited on the inner peripheral wall of groove 16, by means of a thermal oxidation process. Silicon nitride layer 13 and silicon oxide layer 12 are also totally removed. Thereafter, silicon oxide layer 18 is deposited, by means of the thermal oxidation process, to a thickness of 500–2000 Å, and silicon nitride layer 19 is formed, by the CVD process, to a thickness of 500–3000 Å over the entire surface of the substrate, including the inner peripheral wall of groove 16. Thereafter, polycrystalline silicon layer 20 is formed, by means of the CVD process, to a thickness of about 1000–5000 Å (FIG. 3C).

Figure 3D:
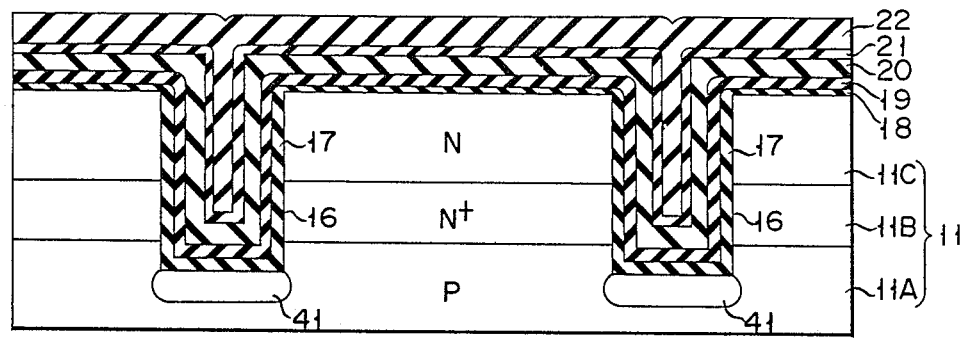

Subsequently, silicon nitride layer 21 is formed, by way of the CVD process, on the surface of polycrystalline silicon layer 20, to a thickness of about 1000 Å. Then, polycrystalline silicon layer 22 is grown, using the CVD process, so as to fill groove 16. The thickness of polycrystalline silicon layer 22 is defined with the width of groove 16 taken into account. If the initial width of groove 16 is set at 15 microns, polycrystalline silicon layer 22 having a thickness of about 1 micron will substantially fill groove 16 (FIG. 3D).

Figure 3E:
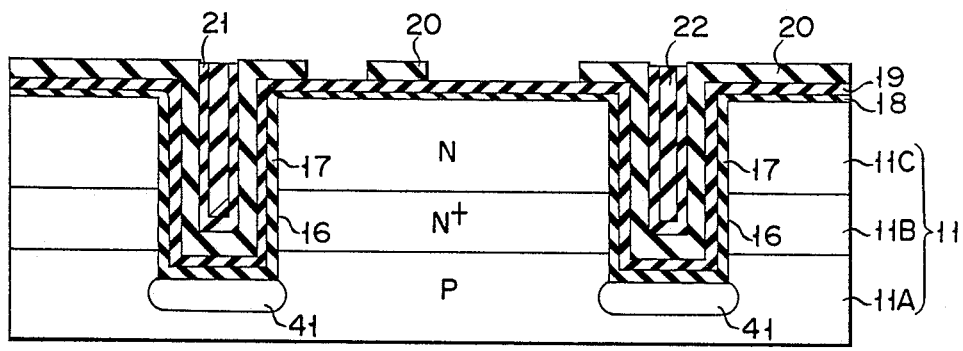

Polycrystalline silicon layer 22 is etched by means of the anisotropic etching process involving the use of a plasma of chlorine base gas, until that portion of silicon nitride layer 21 which is formed on the flat surface of substrate 11 is exposed. This etching causes second polycrystalline silicon layer 22 to be retained only in the interior of groove 16. Silicon nitride layer 21, exposed on the surface of semiconductor substrate 11, is removed by use of an isotropic dry etching process. Thereafter patterning is etched on the substrate so as to selectively retain polycrystalline silicon layer 20 only in the neighborhood of groove 16 and on that portion of the surface of the semiconductor substrate 11 on which no element is formed. That portion of silicon nitride layer 21 exposed on the surface of the semiconductor substrate 11 is etched by means of the isotropic dry etching process. Thereafter, patterning is performed so as to selectively retain polycrystalline silicon layer 20 only in the neighborhood of groove 16 and on that portion of the surface of the semiconductor substrate 11 on which no element is formed (FIG. 3E).

Figure 3F:
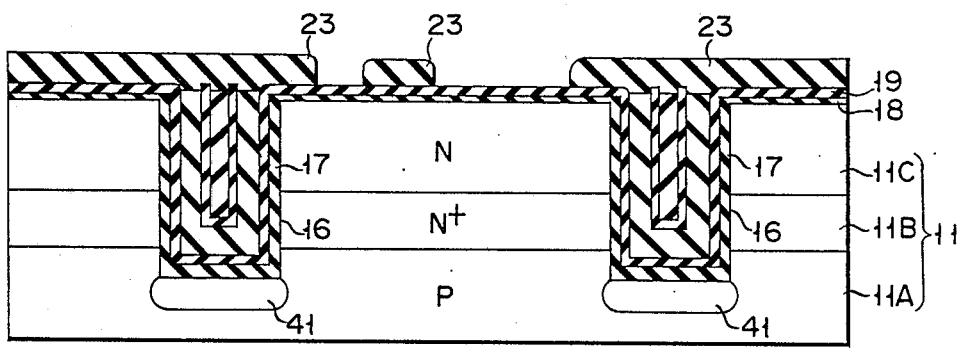

Afterwards, the surface of polycrystalline silicon layer 20 and that of polycrystalline silicon layer 22 embedded in groove 16 are thermallyoxidized, thereby forming thick field oxide layer 23 (FIG. 3F).

Figure 3G:
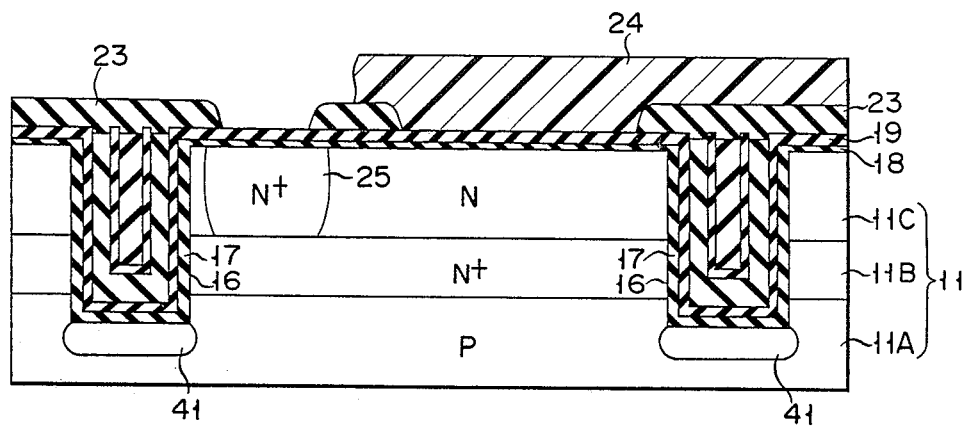

Then, photoresist layer 24 is formed over the entire surface of layer 23, and patterning is performed so as to provide an opening in that portion of an NPN transistor on which a collector electrode is to be provided. Then, phosphorus is ion implanted, with photoresist 24 and field oxide layer 23 serving as masks, thereby forming N+-type collector leadout layer 25 (FIG. 3G).

Figure 3H:
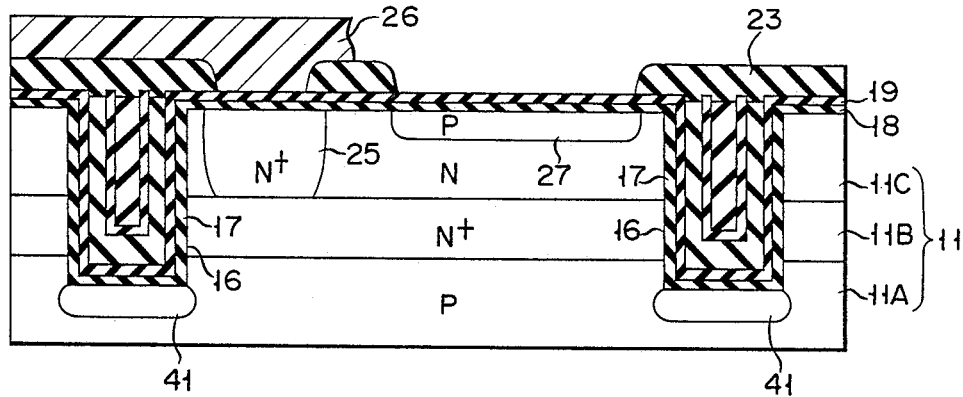

Subsequently, photoresist layer 26 is formed over the entire surface of layer 23, and is so patterned as to cover collector leadout layer 25. Then, boron is ion implanted, with photoresist layer 26 and field oxide layer 23 serving as masks, thereby forming P-type base layer 27 on the surface of N-type epitaxial layer 11C (FIG. 3H).

Figure 3I:
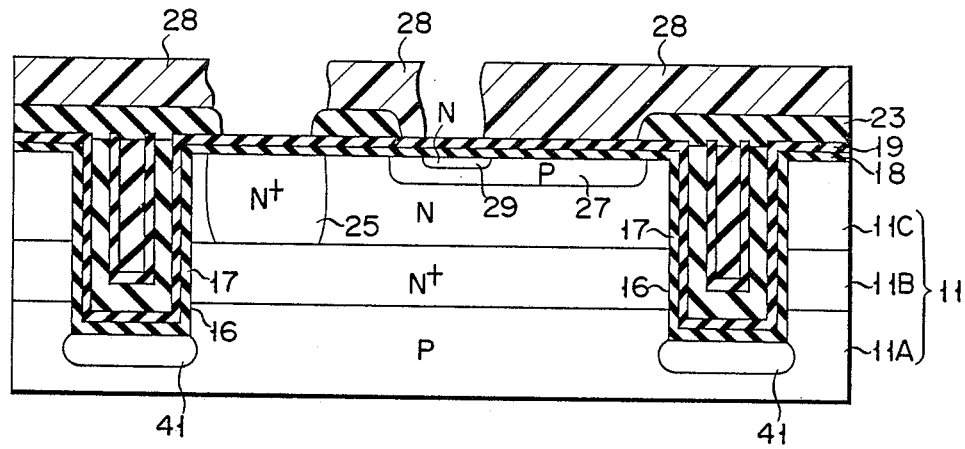

Thereafter, photoresist layer 28 is formed over the entire exposed surface, and is patterned in such a manner that a perforated opening is formed at points facing collector leadout layer 25 and base layer 27. Thereafter, phosphorus is ion implanted, with photoresist layer 28 serving as a mask, thereby depositing N-type emitter layer 29 on the surface of base layer 27 (FIG. 3I).

Figure 3J:
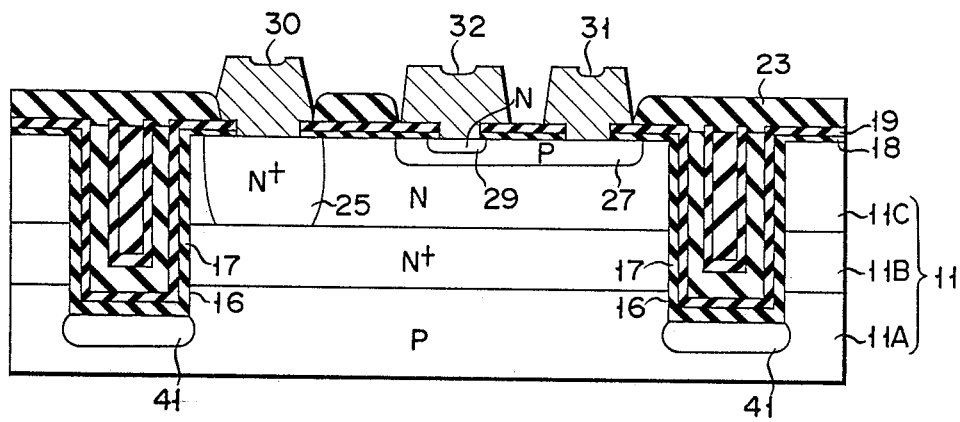

Subsequently, contact holes are formed so as to respectively contact the surfaces of collector leadout layer 25, base layer 27, and emitter layer 29. An aluminium layer is then deposited by vacuum evaporation over the entire exposed surface, and is patterned to provide collector electrode 30, base electrode 31, and emitter electrode 32, thereby providing a completed NPN transistor (FIG. 3J).

The above-mentioned embodiment of this invention offers the advantages in that the growth and etching of a polycrystalline silicon layer can be effected in a short period of time for the same reason as given with reference to FIGS. 2A–2F; no stepped portion appears on the surface of the semiconductor surface; and no crystal defects are produced in the semiconductor substrate.

It should be noted that this invention is not limited to the aforementioned embodiment, but can be applied in various modifications. For instance, the foregoing embodiment refers to the case where groove 16 is formed first, and then silicon oxide layer 18 and silicon nitride layer 19 are deposited. However, it is possible for silicon oxide 18 alone to be deposited. In such a case, the rate at which the surface of the semiconductor substrate is to be oxidized can be controlled on the basis of the relationship between the thickness of deposited polycrystalline silicon layer 20 and that of field oxide layer 23 to be formed. In the above-mentioned embodiment, the formation of groove 16 is carried out after the removal of photoresist layer 15 formed on the surface of silicon oxide layer 12, silicon nitride layer 13, and silicon oxide layer 14. It is, however, possible to form groove 16 with photoresist 15 retained.

What is claimed is:

1. A method of manufacturing a semiconductor apparatus, which comprises the steps of:
   forming a groove in a semiconductor substrate, said substrate having a region in which a plurality of active elements are formed, said groove being formed in an area other than said region;
   forming a first continuous insulation layer on the inner periphery of the groove and on the surface of the semiconductor substrate;
   forming a first polycrystalline silicon layer on the first insulation layer, said first polycrystalline silicon layer having such thickness that the groove is not completely filled;
   coating the first polycrystalline silicon layer with a second insulation layer;
   forming a second polycrystalline silicon layer on the second insulation layer, with a thickness sufficient to fill the groove;
   retaining the second polycrystalline silicon layer only in the groove;
   removing that portion of the first polycrystalline silicon layer which is positioned above that region of the semiconductor substrate and the first insulation layer in which active elements are formed; and
   oxidizing that portion of the first polycrystalline silicon layer which is formed over the semiconductor substrate and the first insulation layer in which no active elements are formed and the portions of the first and second polycrystalline silicon layers formed in the groove, thereby forming a field oxide layer.

2. The method of manufacturing a semiconductor apparatus according to claim 1, wherein the first insulation layer contains an acidproof sublayer and a silicon oxide sublayer.

3. The method of manufacturing a semiconductor apparatus according to claim 1, wherein the second polycrystalline silicon layer is first retained only in the groove, and thereafter that portion of the second insulation layer which is retained on the surface of the semiconductor substrate except for the groove is removed.

4. The method of manufacturing a semiconductor apparatus according to claim 1, wherein the side wall of the groove is rendered perpendicular to the flat surface of the semiconductor substrate.

5. The method of manufacturing a semiconductor apparatus according to claim 1, wherein the side wall of the groove is rendered substantially perpendicular to the flat surface of the semiconductor substrate.

6. The method of manufacturing a semiconductor apparatus according to claim 1, wherein, before the formation of the groove in the semiconductor substrate, a first silicon oxide layer, a first silicon nitride layer, and a second silicon oxide layer used as an etching mask for the formation of the groove are deposited, in the order stated, on the surface of the semiconductor substrate; a photoresist layer is formed over all these layers; the photoresist layer is patterned; the three layers are selectively etched; and last the photoresist layer is removed.

7. The method of manufacturing a semiconductor apparatus according to claim 1, wherein the groove is formed in the semiconductor apparatus by means of anisotropic etching involving the use of the reactive ion etching method.

8. The method of manufacturing a semiconductor apparatus according to claim 1, wherein the process of retaining the second polycrystalline silicon layer only in the groove comprises the step of etching the second polycrystalline layer until that portion of the second insulation layer which is deposited on the flat surface of the semiconductor substrate is exposed.

9. The method of manufacturing a semiconductor apparatus according to claim 2, wherein the acidproof layer constituting the first insulation layer is a silicon nitride layer.

10. The method of manufacturing a semiconductor apparatus according to claim 1, wherein the second insulation layer is prepared from silicon nitride.

11. The method of manufacturing a semiconductor apparatus according to claim 1, wherein the first polycrystalline silicon layer is prepared by use of the chemical vapor deposition process.

12. A method of manufacturing a semiconductor apparatus, which comprises the steps of:

depositing a first silicon oxide layer, a first silicon nitride layer, and a second silicon oxide layer, in the order stated, on the surface of a semiconductor substrate, said semiconductor substrate having a region in which a plurality of active elements are formed;

forming a photoresist layer over all of said first silicon oxide layer, said first silicon nitride layer and said second silicon oxide layer;

patterning said photoeresist layer;

etching the portions of said first silicon oxide layer, said first silicon nitride layer and said second silicon oxide layer not covered by said patterned photoresist layer;

removing said photoresist layer;

forming a groove in the semiconductor substrate in a portion of said substrate other than said region, said second silicon oxide layer being used as an etching mask for the formation of the groove;

forming a first continuous insulation layer on the inner periphery of the groove and on the surface of the semiconductor substrate, the second silicon oxide layer is removed before the first insulation layer is formed on the inner peripheral wall of the groove, as well as over the surface of the semiconductor substrate;

forming a third silicon oxide layer on the inner peripheral wall of the groove;

removing the first silicon nitride layer and first silicon oxide layer;

forming a first polycrystalline silicon layer on the first insulation layer, said first polycrystalline silicon layer having such thickness that the groove is not completely filled;

coating the first polycrystalline silicon layer with a second insulation layer;

forming a second polycrystalline silicon layer on the second insulation layer, with a thickness sufficient to fill the groove;

retaining the second polycrystalline silicon layer only in the groove;

removing that portion of the first polycrystalline silicon layer which is positioned above that region of the semiconductor substrate and the first insulation layer in which active elements are formed; and oxidizing that portion of the first polycrystalline silicon layer positioned above that region of the semiconductor substrate and the first insulation layer in which no active elements are formed and the portions of the first and second polycrystalline silicon layers formed in the groove, thereby forming a field oxide layer.

* * * * *